(12) United States Patent
Conti et al.

(10) Patent No.: US 9,628,919 B2
(45) Date of Patent: Apr. 18, 2017

(54) WAFER LEVEL ASSEMBLY OF A MEMS SENSOR DEVICE AND RELATED MEMS SENSOR DEVICE

(71) Applicant: STMicroelectronics S.r.l., Agrate Brianza (IT)

(72) Inventors: Sebastiano Conti, Mistretta (IT);
Matteo Perletti, Vaprio d'Adda (IT);
Roberto Carminati, Piancogno (IT);
Lorenzo Baldo, Bareggio (IT);
Alessandro Morcelli, Montello (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/265,053

(22) Filed: Apr. 29, 2014

(65) Prior Publication Data
US 2014/0319630 A1     Oct. 30, 2014

(30) Foreign Application Priority Data
Apr. 30, 2013 (IT) ............... TO2013A0350

(51) Int. Cl.
| H01L 29/84 | (2006.01) |
| H04R 19/00 | (2006.01) |
| H04R 1/04 | (2006.01) |
| H04R 19/04 | (2006.01) |

(52) U.S. Cl.
CPC .......... H04R 19/005 (2013.01); H01L 29/84 (2013.01); H04R 1/04 (2013.01); H04R 19/04 (2013.01)

(58) Field of Classification Search
CPC ....... H01L 29/84; H04R 19/005; H04R 19/04; H04R 1/04
See application file for complete search history.

(56) References Cited

U.S. PATENT DOCUMENTS

| 6,088,463 | A | 7/2000 | Rombach et al. |
| 6,590,799 | B1 | 7/2003 | Rickes et al. |
| 6,781,231 | B2 | 8/2004 | Minervini |
| 8,525,278 | B2 * | 9/2013 | Chu .................. H01L 24/81 257/415 |
| 2004/0140475 | A1 * | 7/2004 | Sun ................... B81C 1/00269 257/100 |
| 2007/0189568 | A1 | 8/2007 | Wilk et al. |
| 2010/0084752 | A1 * | 4/2010 | Horning ............... B81B 7/0038 257/682 |

(Continued)

FOREIGN PATENT DOCUMENTS

| CN | 1387741 A | 12/2002 |
| CN | 101640834 A | 2/2010 |

(Continued)

*Primary Examiner* — Michele Fan
(74) *Attorney, Agent, or Firm* — Seed Intellectual Property Law Group LLP (57) ABSTRACT

An assembly of a MEMS sensor device envisages: a first die, integrating a micromechanical detection structure and having an external main face; a second die, integrating an electronic circuit operatively coupled to the micromechanical detection structure, electrically and mechanically coupled to the first die and having a respective external main face. Both of the external main faces of the first die and of the second die are set in direct contact with an environment external to the assembly, without interposition of a package.

18 Claims, 7 Drawing Sheets

(56) References Cited

U.S. PATENT DOCUMENTS

| | | |
|---|---|---|
| 2010/0158279 A1 | 6/2010 | Conti et al. |
| 2010/0258950 A1* | 10/2010 | Li ................... B81C 1/00269 257/777 |
| 2010/0284553 A1 | 11/2010 | Conti et al. |
| 2011/0293128 A1* | 12/2011 | Kuratani ............. B81B 7/0064 381/361 |
| 2012/0056279 A1* | 3/2012 | Huang .................. B81B 7/007 257/415 |
| 2012/0235256 A1* | 9/2012 | Zoellin ............... H04R 19/005 257/416 |
| 2012/0318060 A1* | 12/2012 | Ruby .................. G01P 15/125 73/514.32 |
| 2013/0001710 A1* | 1/2013 | Daneman .............. H01L 23/10 257/415 |
| 2013/0043547 A1* | 2/2013 | Chu ..................... H01L 24/81 257/415 |
| 2013/0119492 A1* | 5/2013 | Feiertag ............ B81C 1/00238 257/416 |
| 2013/0168840 A1 | 7/2013 | Merassi et al. |
| 2013/0285165 A1* | 10/2013 | Classen ............ B81C 1/00238 257/415 |
| 2013/0334626 A1* | 12/2013 | Weber ................. B81B 3/0018 257/416 |
| 2014/0084395 A1* | 3/2014 | Sparks ................. G01L 9/008 257/416 |
| 2014/0151821 A1* | 6/2014 | Liang .................. B81B 3/0021 257/415 |
| 2015/0146894 A1* | 5/2015 | Ng ..................... B81C 1/0023 381/175 |

FOREIGN PATENT DOCUMENTS

| | | | |
|---|---|---|---|
| CN | 101665230 A | 3/2010 | |
| CN | 102158775 A * | 8/2011 | ........... H04R 19/005 |
| CN | 102404676 A | 4/2012 | |
| CN | 102685657 A | 9/2012 | |
| CN | 204281296 U | 4/2015 | |
| EP | 2 252 077 A1 | 11/2010 | |
| EP | 2 517 480 A1 | 10/2012 | |
| WO | 2007/042336 A2 | 4/2007 | |
| WO | 2007/112743 A1 | 10/2007 | |
| WO | 2011/076910 A1 | 6/2011 | |
| WO | 2012/025794 A1 | 3/2012 | |

* cited by examiner

WAFER LEVEL ASSEMBLY OF A MEMS SENSOR DEVICE AND RELATED MEMS SENSOR DEVICE

BACKGROUND

Technical Field

The present invention relates to a wafer level assembly of a MEMS sensor device; in particular, the following description will make reference, without thereby this implying any loss in generality, to the assembly of a MEMS sensor device including an acoustic transducer.

Description of the Related Art

Sensor devices are known including micromechanical structures made, at least in part, of semiconductor materials and made using MEMS (Micro-Electro-Mechanical Systems) technology. These sensor devices are used in portable electronic apparatuses, such as, for example, portable computers, laptops or ultrabooks, PDAs, tablets, mobile phones, smartphones, digital audio players, photographic cameras or video cameras, and consoles for videogames, enabling important advantages to be obtained with regard to size occupation, in terms of area and thickness.

A MEMS sensor device generally comprises: a micromechanical detection structure, designed to transduce a mechanical quantity to be detected (for example, acoustic waves, pressure, etc.) into an electrical quantity (for example, a capacitive variation); and an electronic reading circuit, usually provided as ASIC (Application-Specific Integrated Circuit), designed to execute suitable processing operations (amongst which amplification and filtering operations) of the electrical quantity so as to provide an electrical output signal, whether analog (for example, a voltage) or digital (for example a PDM—Pulse Density Modulation—signal). This electrical signal, possibly further processed by an electronic interface circuit, is then made available for an external electronic system, for example, a microprocessor control circuit of the electronic apparatus incorporating the sensor device.

The micromechanical detection structure of a MEMS acoustic transducer, of a capacitive type, generally comprises a mobile electrode, provided as a diaphragm or membrane, facing a substantially fixed electrode. The mobile electrode is generally anchored, by means of a perimetral portion thereof, to a substrate, whilst a central portion thereof is free to move or bend in response to acoustic-pressure waves incident on a surface thereof. The mobile electrode and the fixed electrode provide the plates of a detection capacitor, and bending of the membrane that constitutes the mobile electrode causes a variation of capacitance of this detection capacitor. During operation, the capacitance variation is converted by suitable processing electronics into an electrical signal, which is supplied as output signal of the MEMS acoustic transducer.

A MEMS acoustic transducer of a known type is, for example, described in detail in patent application No. US 2010/0158279 A1 (to which reference is made herein), filed in the name of the present Applicant.

Figure 1:
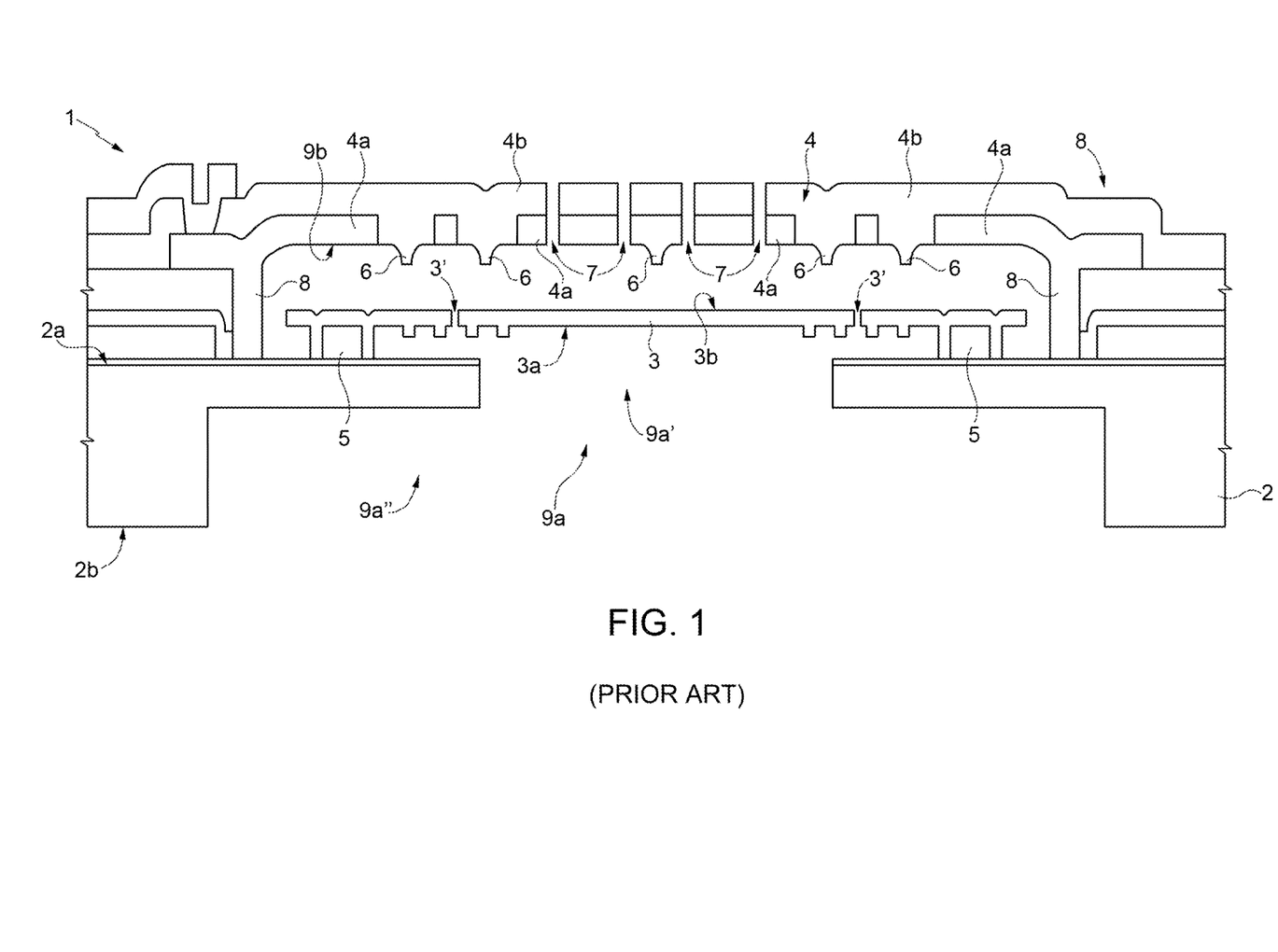
FIG. 1 is a schematic cross-sectional representation of a portion of a micromechanical detection structure of a MEMS sensor device of a known type.

A portion of the micromechanical detection structure of the acoustic transducer is shown by way of example in FIG. 1, being designated as a whole by 1.

The micromechanical detection structure 1 comprises a substrate 2 made of semiconductor material, and a mobile membrane (or diaphragm) 3. The membrane 3 is made of conductive material and faces a fixed electrode or rigid plate 4, generally known as "back plate", which is rigid, at least if compared with the membrane 3, which is, instead, flexible and undergoes deformation as a function of the incident acoustic-pressure waves.

The membrane 3 is anchored to the substrate 2 by means of membrane anchorages 5, formed by protuberances of the membrane 3, which extend from peripheral regions of the same membrane 3 towards the substrate 2.

For instance, the membrane 3 has, in plan view, i.e., in a horizontal plane of main extension, a generically square shape, and the membrane anchorages 5, which are four in number, are set at the vertices of the square.

The membrane anchorages 5 suspend the membrane 3 over the substrate 2, at a certain distance therefrom; the value of this distance is the result of a compromise between the linearity of response at low frequencies and the noise of the acoustic transducer.

In order to enable relief of residual (tensile and/or compressive) stresses in the membrane 3, for example, stresses deriving from the manufacturing process, through openings 3' may be formed through the membrane 3, in particular in the proximity of each membrane anchorage 5, in order to "equalize" the static pressure present on the surfaces of the same membrane 3.

The rigid plate 4 is formed by a first plate layer 4a, made of conductive material and set facing the membrane 3, and a second plate layer 4b, made of insulating material.

The first plate layer 4a forms, together with the membrane 3, the detection capacitor of the micromechanical detection structure 1.

In particular, the second plate layer 4b overlies the first plate layer 4a, except for portions in which it extends through the first plate layer 4a so as to form protuberances 6 of the rigid plate 4, which extend towards the underlying membrane 3 and have the function of preventing adhesion of the membrane 3 to the rigid plate 4, as well as of limiting the oscillations of the same membrane 3.

For instance, the thickness of the membrane 3 is comprised in the range 0.3-1.5 µm, for example, it is equal to 0.7 µm, the thickness of the first plate layer 4a is comprised in the range 0.5-2 µm, for example, it is equal to 0.9 µm, and the thickness of the second plate layer 4b is comprised in the range 0.7-2 µm, and, for example, it is equal to 1.2 µm.

The rigid plate 4 moreover has a plurality of holes 7, which extend through the first and second plate layers 4a, 4b, have, for example, a circular cross section, and allow, during the manufacturing steps, removal of the underlying sacrificial layers. Holes 7 are, for example, arranged so as to form a lattice in a horizontal plane, parallel to the substrate. Moreover, in use, holes 7 enable free circulation of air between the rigid plate 4 and the membrane 3, in effect rendering the rigid plate 4 acoustically transparent. Holes 7 hence provide an acoustic port, to enable acoustic-pressure waves to reach and deform the membrane 3.

The rigid plate 4 is anchored to the substrate 2 by means of plate anchorages 8, which are joined to peripheral regions of the same rigid plate 4.

In particular, plate anchorages 8 are formed by vertical pillars (i.e., pillars extending in a direction orthogonal to the horizontal plane and to the substrate 2), made of the same conductive material as the first plate layer 4a and hence forming a single piece with the rigid plate 4; in other words, the first plate layer 4a has prolongations that extend as far as the substrate 2, defining the anchorages of the rigid plate 4.

The membrane 3 is suspended over and directly faces a first cavity 9a, formed within and through the substrate 2, by a through trench formed, such as by etching, starting from a back surface 2b of the substrate 2, which is opposite to a front surface 2a thereof, on which the membrane anchorages 5 rest (the first cavity 9a hence defines a through hole that extends between the front surface 2a and the rear surface 2b of the substrate 2); in particular, the front surface 2a lies in the horizontal plane.

The first cavity 9a is also known as "back chamber", in the case where the acoustic-pressure waves impinge first upon the rigid plate 4, and then upon the membrane 3. In this case, the front chamber is formed by a second cavity 9b, delimited at the top and at the bottom, respectively, by the first plate layer 4a and the membrane 3.

Alternatively, it is in any case possible for the pressure waves to reach the membrane 3 through the first cavity 9a, which in this case provides an acoustic access port, and, hence, a front chamber.

In greater detail, the membrane 3 has a first main surface 3a and a second main surface 3b, which are opposite to one another and face, respectively, the first and second cavities 9a, 9b, hence being in fluid communication, respectively, with the back chamber and the front chamber of the acoustic transducer.

Moreover, the first cavity 9a is formed by two cavity portions 9a', 9a": a first cavity portion 9a' is arranged at the front surface 2a of the substrate 2 and has a first extension in the horizontal plane; the second cavity portion 9a" is set at the rear surface 2b of the substrate 2 and has a second extension in the horizontal plane, greater than the first extension.

In a known way, the sensitivity of the acoustic transducer depends upon the mechanical characteristics of the membrane 3, as well as upon the assembly of the membrane 3 and of the rigid plate 4 within a corresponding package, which constitutes the interface of the acoustic transducer with respect to the external environment.

In particular, the performance of the acoustic transducer depends on the volume of the back chamber and the volume of the front chamber. The volume of the front chamber determines the upper resonance frequency of the acoustic transducer, and hence its performance at high frequencies; in general, in fact, the smaller the volume of the front chamber, the higher the upper cut-off frequency of the acoustic transducer. Moreover, a large volume of the back chamber enables improvement of the frequency response and the sensitivity of the same acoustic transducer.

The package of the acoustic transducer has to be configured to house not only the micromechanical detection structure 1, but also the reading electronics associated thereto, generally provided as an ASIC, electrically coupled to the micromechanical detection structure 1. At the design stage, the fact is also to be considered that acoustic transducers typically operate in unfavorable working environments, for example, ones subject to high RF radiation and electromagnetic disturbance (when integrated in mobile phones or similar wireless communication devices).

Several constraints are thus imposed on the assembly of the MEMS acoustic transducer and the corresponding package, which render design thereof particularly problematical, where compact dimensions are preferred.

An assembly arrangement that has been proposed envisages providing two distinct dice made of semiconductor material, a first die for the micromechanical detection structure and a second die for the reading circuitry.

Figure 2:
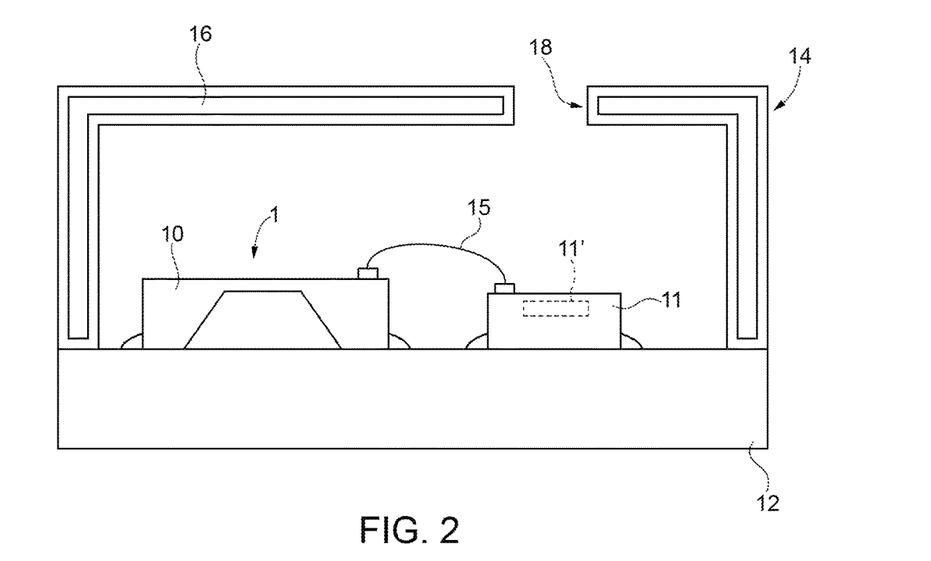
FIG. 2 is a schematic representation of the MEMS sensor device, with the corresponding package.

In a solution of this type, illustrated schematically in FIG. 2 (and described, for example, in U.S. Pat. No. 6,781,231), a first die 10, integrating the micromechanical detection structure 1 (illustrated schematically herein), and a second die 11, integrating an ASIC 11' of the reading electronics, are coupled side by side on a supporting layer 12 of a corresponding package 14. Electrical connections 15 between the first and second dice 11, 12 are provided by means of electrical wires with the wire-bonding technique, whilst appropriate metallization layers and vias (not illustrated in detail) are provided in the supporting layer 12 for routing the electrical signals towards the outside of the package 14.

A cover 16 of the package 14 is moreover coupled to the supporting layer 12, enclosing the first and second dice 11, 12; this cover 16 may be made of metal or pre-molded plastic with internal metallization layers such as to prevent disturbance of external electromagnetic signals (by providing a sort of Faraday cage).

The cover 16 moreover has an opening 18 to enable entry of acoustic-pressure waves. Advantageously, a screen for the incident light (not illustrated), or a filter (not illustrated either) may be coupled to opening 18, to prevent penetration into the cover 16 of particles of dust or other material.

Pads (not shown) are provided at the underside of the supporting layer 12 for soldering and electrical connection to an external printed circuit.

This assembly arrangement is not, however, free from drawbacks, amongst which the fact of preferring large dimensions for accommodating the two dice of the acoustic transducer side by side and for providing the corresponding package.

Moreover, this solution does not offer the designer much freedom (as, instead, would be desirable) in the sizing of the chambers of the acoustic transducer, for the determination of its electrical characteristics.

Various assembling and packaging solutions for MEMS acoustic transducers have consequently been proposed, amongst which, for example, those described in U.S. Pat. No. 6,088,463, US 2007/0189568, WO 2007/112743, EP 2 252 077, EP 2 517 480.

However, also these solutions are not optimized as regards the dimensions, assembly costs, and electrical characteristics of the sensors.

The need is consequently felt in the field to provide an appropriate assembly of a MEMS sensor device, which can provide low manufacturing costs, high performance and reliability, and contained dimensions to be met.

BRIEF SUMMARY

One or more embodiments are directed to an assembly of a MEMS sensor device. One embodiment is directed to an assembly comprising first and second dice. The first and second dice have an internal surface and an external surface, respectively. A micromechanical detection structure is located on the internal surface of the first die. The second die integrates an electronic circuit operatively coupled to said micromechanical detection structure. The internal surface of the second die is coupled to the internal surface of said first die. The external surfaces of the first and second dice form the external surfaces of the assembly that are configured to be placed in direct contact with a structure external to the assembly.

BRIEF DESCRIPTION OF THE SEVERAL VIEWS OF THE DRAWINGS

For a better understanding of the present invention, preferred embodiments thereof are now described, purely by way of non-limiting example and with reference to the attached drawings, wherein.

DETAILED DESCRIPTION

As will be described in detail hereinafter, the general idea underlying the present solution envisages using the same dice that integrate the micromechanical detection structure and the corresponding ASIC, as direct interfaces of a MEMS sensor device with the external environment, both as regards the mechanical and electrical connection, for example, to a printed circuit board, and as regards coupling with the mechanical quantity or quantities to be detected. The assembly of the MEMS sensor device hence does not envisage the presence of a package, and outer surfaces of the same assembly, designed for electrical and mechanical contact with the external environment, are constituted by external faces of the aforesaid dice.

Figure 3:
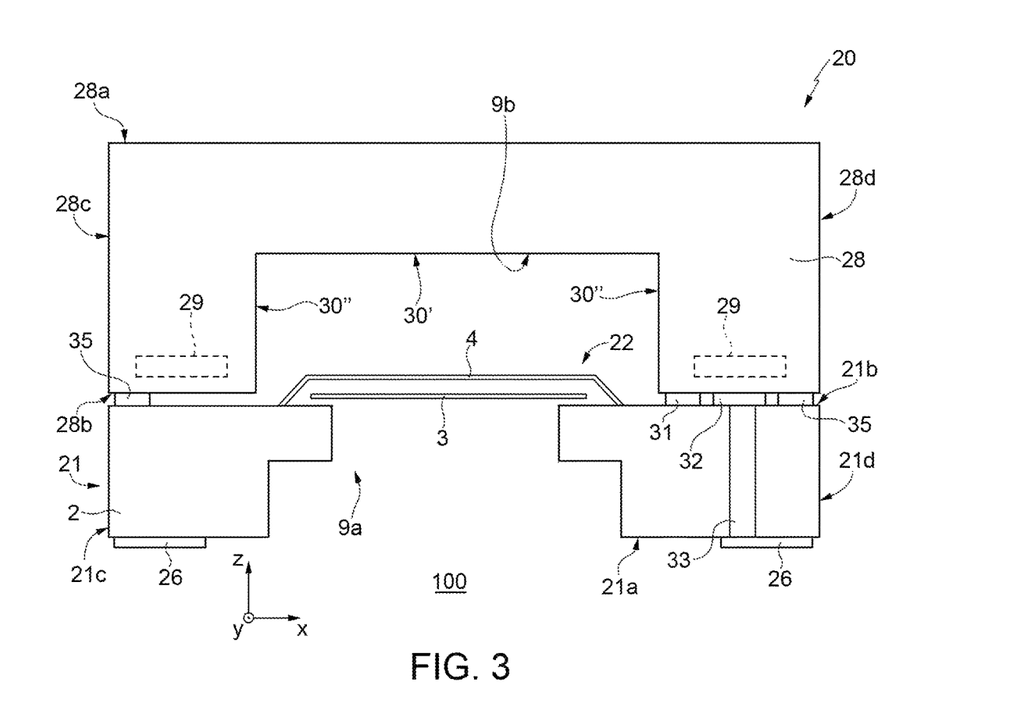
FIG. 3 is a schematic cross-sectional representation of a first embodiment of an assembly of a MEMS sensor device according to the present solution.

FIG. 3 shows a first embodiment of an assembly of a MEMS sensor device, designated as a whole by 20.

The MEMS sensor device 20 comprises a first die 21, including semiconductor material, in particular silicon, integrating a micromechanical detection structure 22.

For instance, the micromechanical detection structure 22, illustrated schematically, defines an acoustic transducer, being made as described with reference to FIG. 1 (so that, in what follows, same reference numbers will be used for designating similar elements).

The micromechanical detection structure 22 hence comprises: a substrate 2, provided through the thickness of which is the first cavity 9a, which has in plan view (i.e., in a horizontal plane xy) a generically polygonal, for example square, shape; a membrane 3, which is suspended over the first cavity 9a and may undergo deformation as a function of the incident acoustic-pressure waves; and a rigid plate 4, mechanically connected to the substrate 2 and capacitively coupled to the membrane 3.

In particular, in the embodiment described, the first die 21 constitutes a lower portion of the assembly (with respect to a vertical axis z orthogonal to the horizontal plane xy) that is designed to provide a mechanical and electrical connection to an external printed circuit board (not shown).

For instance, the first die 21 has a thickness, along vertical axis z, orthogonal to the horizontal plane xy, of 200 µm.

The first die 21 has an external main face 21a, lying in the horizontal plane xy, designed to be in direct contact with the external environment, here designated as a whole by 100, and in electrical and mechanical contact with the aforesaid external printed circuit board (hence providing an outer surface of the entire assembly), which carries for this purpose suitable external electrical-connection elements 26, such as, for example, lands or conductive bumps, according to the particular connection technology used (for example, LGA—land-grid array, or BGA—ball-grid array).

The first die 21 moreover has an internal main face 21b, vertically opposite to the external main face 21a, at which the membrane 3 of the acoustic transducer is arranged, and coupled to which is the rigid plate 4 of the same acoustic transducer.

The first die 21 moreover has lateral faces 21c, 21d, set parallel to the vertical axis z, which are also in communication with the external environment and constitute outer surfaces of the entire assembly.

In the example illustrated, where the MEMS sensor device 20 includes an acoustic transducer, the first cavity 9a terminates at the aforesaid external main face 21a and constitutes an inlet port for the acoustic-pressure waves; in other words, the first cavity 9a constitutes the so-called front chamber of the acoustic transducer. The electrical-connection elements 26 are set laterally with respect to the first cavity 9a.

This assembly arrangement is defined as being of the "bottom port" type, with acoustic access port on the lower portion of the assembly, which is to be set in the proximity of the external printed circuit board.

MEMS sensor device 20 further comprises a second die 28, including semiconductor material, in particular silicon, integrating an ASIC 29 (illustrated schematically), coupled to the micromechanical detection structure 22.

In particular, the second die 28 has: a respective external main face 28a, designed to be in direct communication with the external environment (hence providing an outer surface of the entire assembly); and a respective internal main face 28b, which faces the internal main face 21b of the first die 21 and is mechanically and electrically coupled thereto. The ASIC 29 is, for example, provided in an area corresponding to a portion of the internal main face 28b of the second die 28.

Moreover, the second die 28 has lateral faces 28c, 28d, set parallel to the vertical axis z, which are also in communication with the external environment and constitute, together with the lateral faces 21c, 21d of the first die 21, external lateral surfaces of the entire assembly.

For instance, the second die 28 has a thickness, along the vertical axis z, of 700 µm.

In the second die 28, starting from the internal main face 28b, a second cavity 9b is provided, which occupies a position corresponding to the micromechanical detection structure 22, and the corresponding membrane 3 and rigid plate 4. In particular, the second cavity 9b is delimited at the top, parallel to the surface of the internal main face 28b and to the horizontal plane xy, by a bottom wall 30', which is separated from the external main face 28a by a portion of the second die 28 having a thickness less than the entire thickness of the same second die 28, and laterally by side walls 30". For instance, second cavity 9b is square or rectangular in plan view.

In the embodiment described, the second cavity 9b represents the so-called back chamber of the MEMS acoustic transducer. More in general, the presence of the second cavity 9b may enable deformation of deformable elements of the micromechanical detection structure 22 (for example, a membrane or diaphragm). Although not shown, it is to be appreciated that in some embodiments, the second die 28 may include a through hole that places the second cavity 9b in fluid communication with an environment external to the device 20.

First internal electrical-connection elements 31 (constituted by pads or paths of conductive material, illustrated schematically), set between the internal main faces 21b, 28b of the first and second dice 21, 28, electrically connect the micromechanical structure 22 to the ASIC 29 (for example, connect appropriate electrical contacts coupled to the membrane 3 and to the rigid plate 4 with appropriate circuit elements of the aforesaid ASIC 29). Moreover, second internal electrical-connection elements 32, which are also set between the internal main faces 21b, 28b of the first and second dice 21, 28, electrically connect the ASIC 29 to the external electrical-connection elements 26 via through silicon vias (TSVs) 33, which traverse the first die 21 throughout its thickness.

In a known manner, the arrangement of the through vias 33 enables appropriate routing of the electrical signals coming from the ASIC 29 to the external connection elements 26.

A coupling structure 35, for example, including a bonding ring, for instance, made of metal material, moreover couples the first die 21 mechanically to the second die 28; this coupling structure 35 is set externally with respect to the first and second internal electrical-connection elements 31, 32, and laterally surrounds the micromechanical structure 22 (and the corresponding membrane 3 and rigid plate 4).

Moreover, the coupling structure 35 laterally provides a sealed closure for the assembly between the first die 21 and the second die 28.

Figure 4:
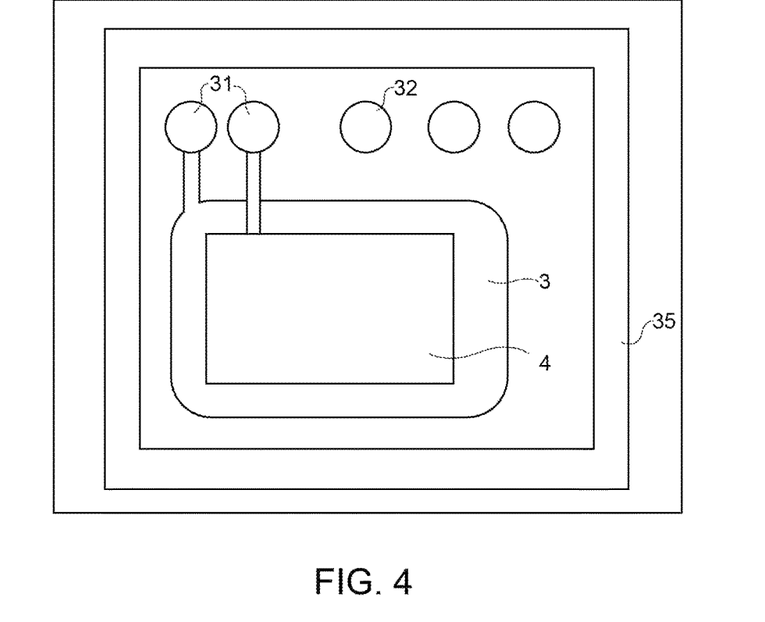
FIG. 4 is a schematic top plan view of the assembly of FIG. 3.

A possible layout of the mechanical and electrical coupling elements described previously is, for example, illustrated schematically in FIG. 4, where the electrical connections of the membrane 3 and of the rigid plate 4 with corresponding first internal electrical-connection elements 31 and second internal electrical-connection elements 32 are moreover illustrated, once again schematically.

Advantageously, at least one, or both, of the first and second dice 21, 28 may have a high doping level, so as to provide a sort of Faraday cage and thus reduce electromagnetic disturbance.

In the embodiment described, once again advantageously, the volume of the front chamber of the acoustic transducer is reduced (as compared to known solutions, such as the one illustrated in FIG. 2, where the same volume cannot be reduced on account of the conformation of the package), and the volume of the back chamber is increased (once again as compared to known solutions, where the same volume is limited by the conformation of the die integrating the micromechanical detection structure).

Figure 5:
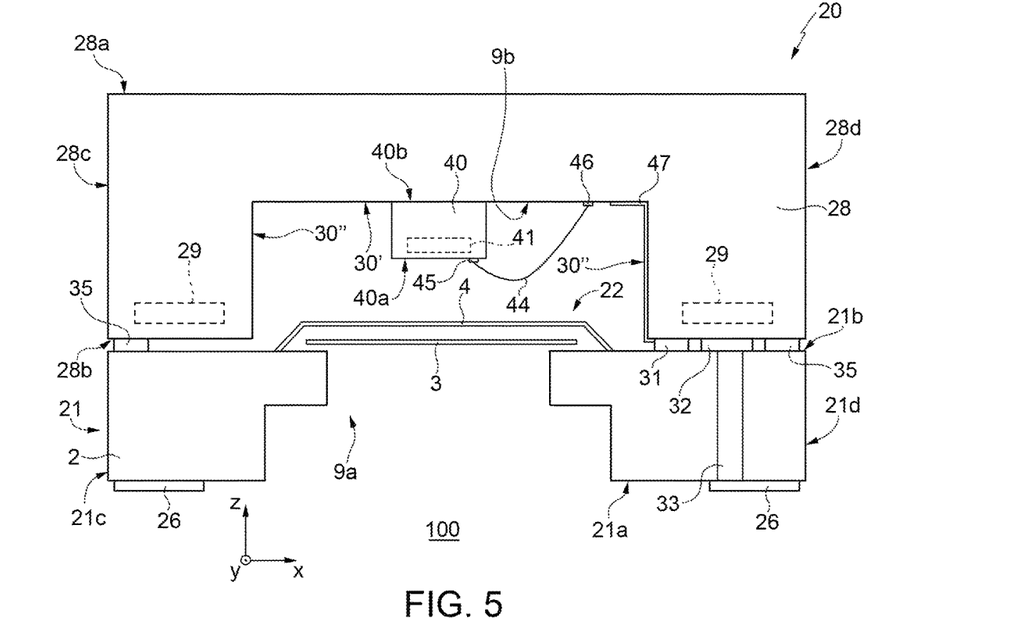
FIG. 5 is a schematic cross-sectional representation of a variant of the assembly of FIG. 3.

As illustrated in FIG. 5, a variant of the embodiment described envisages that the MEMS sensor device 20 includes at least one further transducer, for example, a pressure or humidity transducer.

In particular, the MEMS sensor device 20 comprises a third die 40, integrating a corresponding micromechanical detection structure 41, for example, designed to detect a pressure or humidity value, coupled to the second die 28, within the second cavity 9b.

In detail, the third die 40 has a first main face 40a, at which the micromechanical detection structure 41 is provided, and a second main face 40b, mechanically coupled—for example, by means of a layer of adhesive material (not illustrated)—to the bottom wall 30' of the second cavity 9b.

It is emphasized that, through the first chamber 9a (the front chamber of the acoustic transducer) and the holes made through the membrane 3 and the rigid plate 4, a fluidic path is provided between the external environment 100 and the micromechanical detection structure 41 in the third die 40. In other words, the acoustic-pressure waves, or in general the atmosphere coming from the external environment, which traverse the MEMS acoustic transducer, impinge upon the micromechanical detection structure 41, enabling detection of the further external quantity of interest.

Suitable electrical-connection elements 44, for example, in the form of electrical wires, connect first contact pads 45, carried by the first main face 40a, to second contact pads 46, carried by the bottom wall 30' of the second cavity 9b. Second contact pads 46 are in turn connected, for example, by means of conductive paths 47 (illustrated schematically only in this figure) that develop along the bottom wall 30' itself and/or along at least one of the side walls 30", to the first internal electrical-connection elements 31 and/or the second internal electrical-connection elements 32, and to the ASIC 29.

Alternatively, the electrical-connection elements 44 may connect the first contact pads 45 directly to the aforesaid first and/or second internal electrical-connection elements 31, 32.

Advantageously, this solution enables manufacturing, using semiconductor technology, of an integrated multifunction MEMS sensor device that is able to detect more than one environmental quantity, for example, acoustic waves and pressure and/or humidity present in the external environment, using a single ASIC 29 in common between the various transducers, the ASIC communicating with the external printed circuit board.

Figure 6:
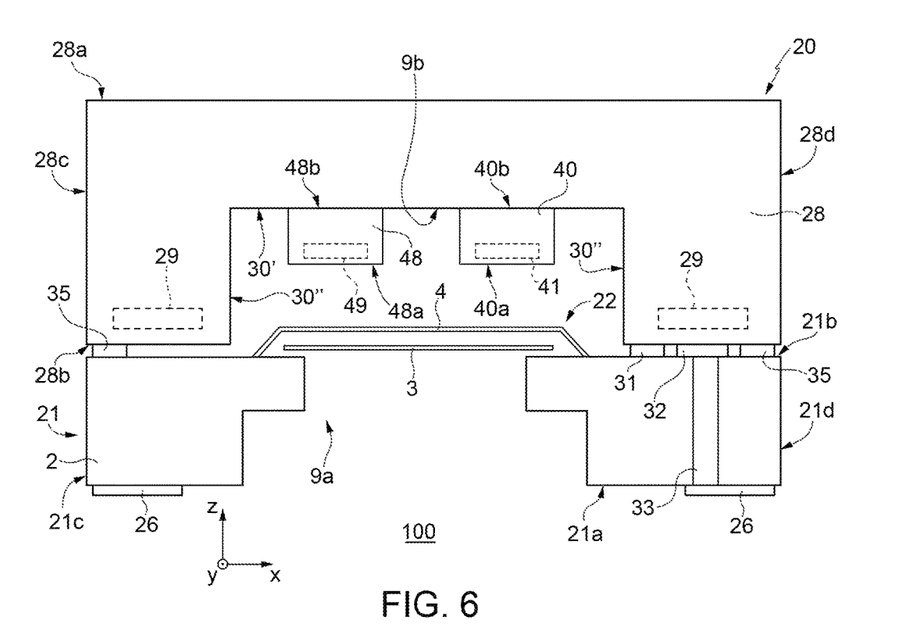
FIG. 6 is a schematic cross-sectional representation of a further variant of the assembly of FIG. 3.

As illustrated in FIG. 6, a further variant of the embodiment illustrated envisages the presence of a fourth die 48, integrating a respective micromechanical detection structure 49 (for example, for providing a humidity transducer in the case where the third die 40 integrates a pressure transducer), coupled to the second die 28 in a way substantially similar to what has been illustrated for the third die 40. In particular, the fourth die 48 has a first main face 48a, at which the micromechanical detection structure 49 is provided, and a second main face 48b coupled to the bottom wall 30' of the second cavity 9b. The fourth die 48 is set alongside the third die 40, within the second cavity 9b.

Advantageously, this solution enables further enhancement of the multifunctional characteristic of the MEMS sensor device 20 as regards detection of environmental quantities.

Figure 7:
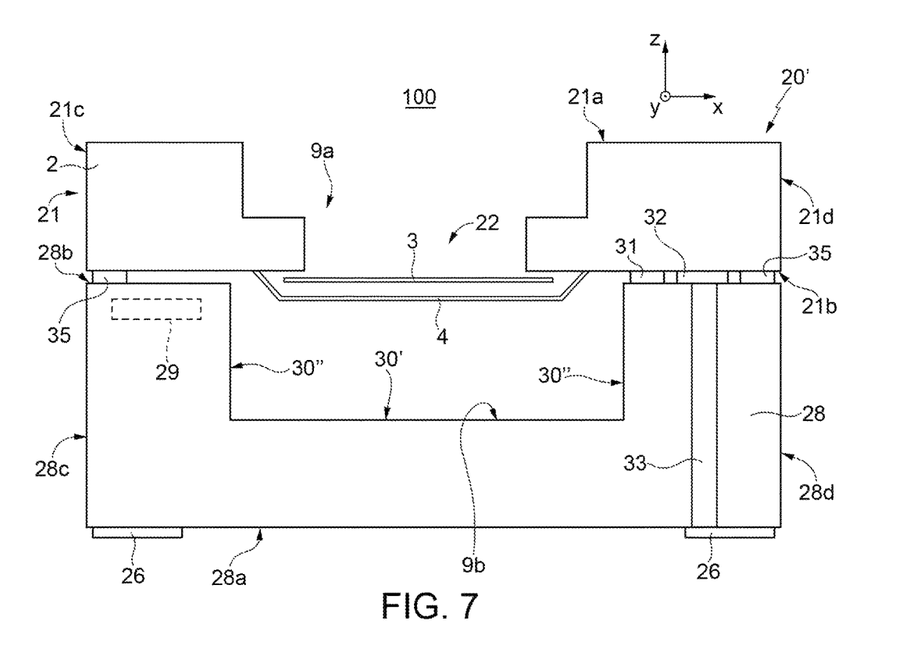
FIG. 7 is a schematic cross-sectional representation of a second embodiment of the assembly of the MEMS sensor device.

With reference to FIG. 7, a second embodiment of the assembly of the MEMS sensor device is now described, here designated by 20', of a "top port" type, i.e., with acoustic inlet port set at a top part of the assembly (i.e., at a distance from the external printed circuit board to which the assembly is to be coupled).

The MEMS sensor device 20' is basically set upside down with respect to the vertical axis z, if compared to the first embodiment described previously.

In particular, in this case, the external main face 28a of the second die 28 is mechanically and electrically coupled to the external printed circuit board (not illustrated in this case) by means of the external electrical-connection elements 26, here carried by the same external main face 28a.

The first cavity 9a provided in the first die 21 here operates as front chamber of the MEMS acoustic transducer for entry of the acoustic-pressure waves, whereas the second cavity 9b made in the second die 28 operates as back chamber; the first cavity 9a is set in direct communication with the external environment 100 at the external main face 21a of the first die 21.

Moreover, the through vias 33 in this case extend through the second die 28.

Figure 8:
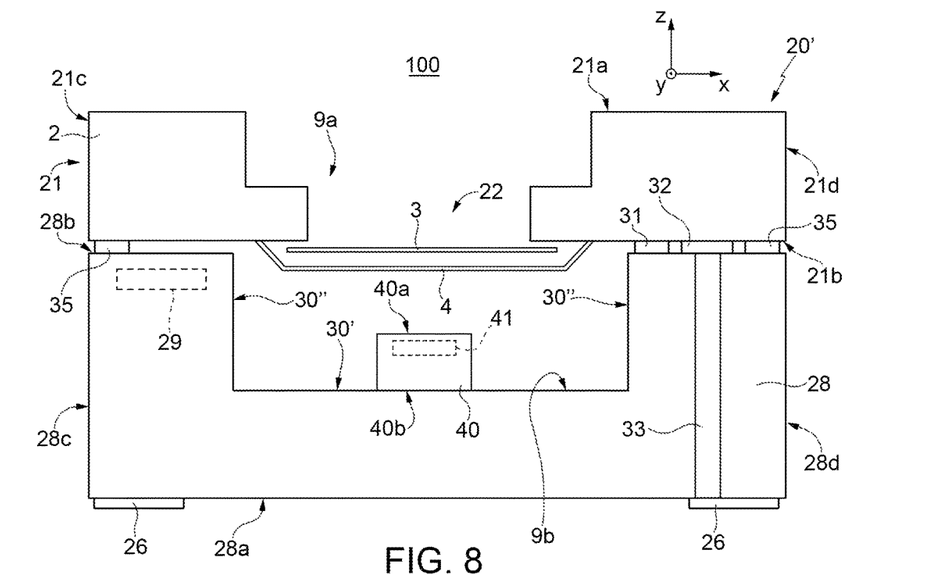
FIG. 8 is a schematic cross-sectional representation of a variant of the assembly of FIG. 7.
Figure 9:
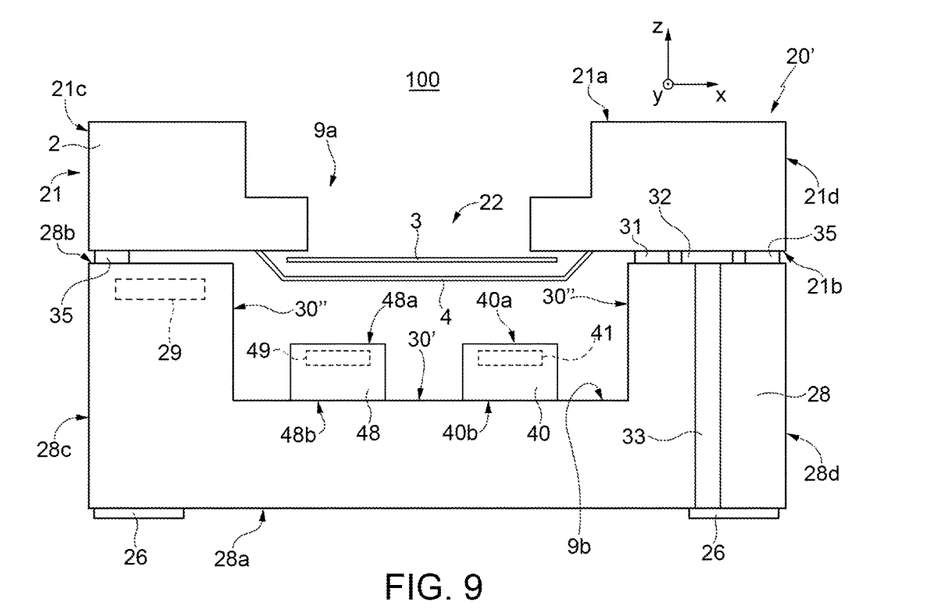
FIG. 9 is a schematic cross-sectional representation of a further variant of the assembly of FIG. 7.

Variants of this embodiment (illustrated in FIGS. 8 and 9) may again envisage that the MEMS sensor device 20' comprises a further die or further dice (the third die 40, and possibly also the fourth die 48) with the respective micromechanical detection structures 41 and 49, for providing a multifunctional environmental detection device.

Figure 10:
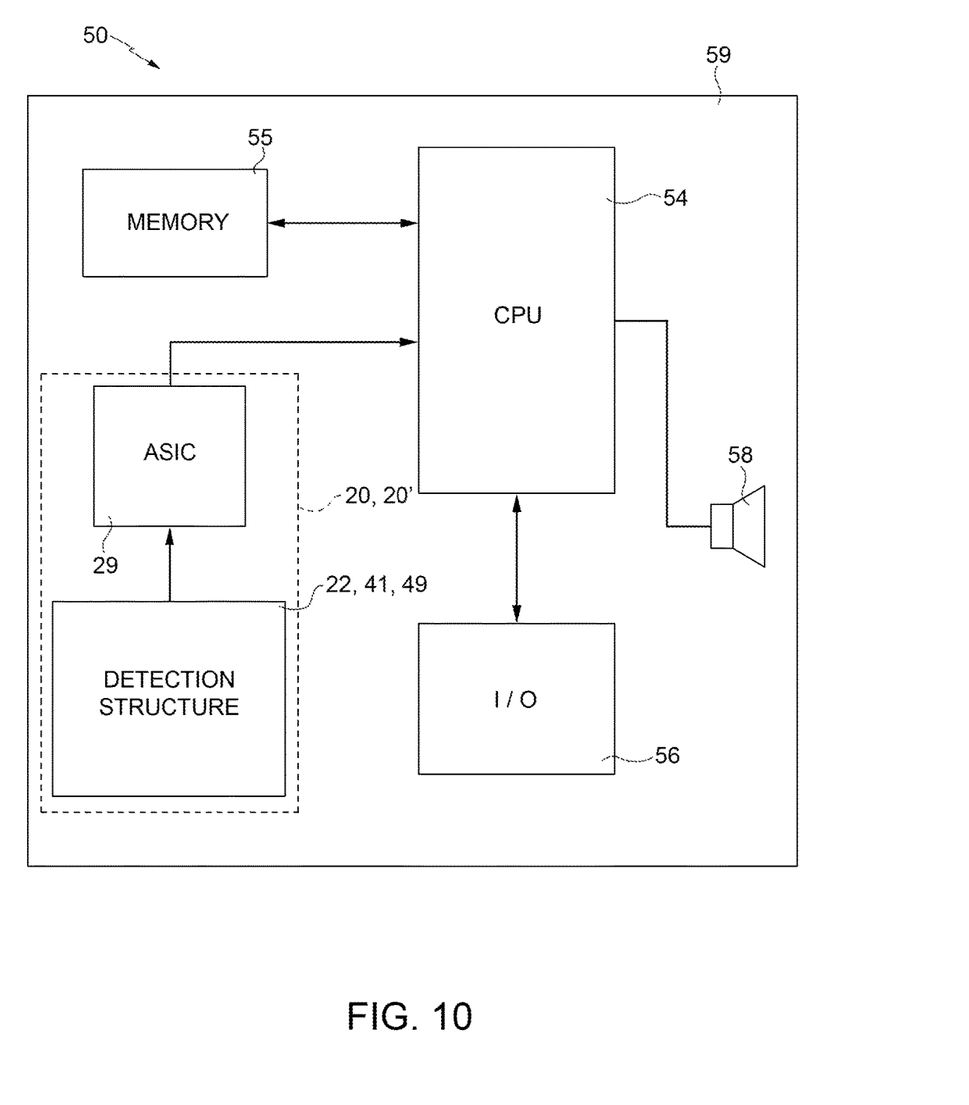
FIG. 10 is a block diagram of an electronic apparatus including the MEMS sensor device.

FIG. 10 is a schematic illustration of an electronic apparatus 50 that includes the MEMS sensor device 20, 20', comprising one or more micromechanical detection structures 22, 41, 49 for detection of respective quantities (for example, of an environmental type) and a single ASIC 29 for processing transduced electrical signals.

The electronic apparatus 50 comprises, in addition to the MEMS sensor device 20, 20', a microprocessor 54, a memory block 55, connected to the microprocessor 54, and an input/output interface 56, for example, including a keyboard and a display, which is also connected to the microprocessor 54. Moreover, a speaker 58 may be present, for generating a sound on an audio output (not shown) of the electronic apparatus 50.

In particular, the electronic apparatus 50 comprises a printed circuit board 59, mechanically and electrically coupled to which are the MEMS sensor device 20, 20' and, among other elements, the microprocessor 54 and the memory block 55.

The electronic apparatus 50 is preferably a mobile communication device, such as for example, a mobile phone, a PDA, a notebook, but also a voice recorder, an audio player with voice-recording capacity, etc. Alternatively, the electronic device 50 may be a hydrophone that is able to operate under water.

The advantages of the solution described herein emerge clearly from the foregoing discussion.

It is in any case once again emphasized that it is possible to obtain an assembly of a MEMS sensor device that is particularly compact, with low manufacturing costs and with high electrical performance. The manufacturing method is simplified, as likewise electrical testing of the sensor device.

In particular, the absence of a package as interface towards the external environment enables an evident saving in the space occupied and a simplification of the manufacturing process, given that the process may be entirely implemented with so-called "front end" steps, using traditional techniques and tools.

For instance, the present Applicant has verified the possibility of providing an assembly with dimensions, in the horizontal plane xy, of 2 mm×2 mm, i.e., smaller than those of known assemblies (for instance, of the type illustrated in FIG. 2, which have, for example, given the same dimensions for the first and second dice 21, 28, dimensions of 2.5 mm×3.35 mm).

Moreover, the assembly described advantageously enables an enhancement in the performance of an associated acoustic transducer, thanks to the advantageous sizing of the front and rear chambers.

Particularly advantageous is the fact that the entire assembly of the MEMS sensor device may be made of semiconductor material, for example, silicon (without the presence of different materials, for example, plastic or ceramic ones, of a corresponding package). Moreover, appropriate doping of the semiconductor material may enable shielding from electromagnetic disturbance.

In addition, the advantages mentioned above are even more important in the case where the MEMS sensor device provides a multifunctional detection device, thanks to the integration in the single assembly of a number of micromechanical detection structures coupled to a single electronic reading circuit.

Finally, it is clear that modifications and variations may be made to what has been described and illustrated herein, without thereby departing from the scope of the present invention.

In particular, it is again emphasized that the described assembly arrangement may be advantageously applied also to MEMS sensor devices that do not include an acoustic transducer, for example, for pressure or humidity sensors.

Figure 11:
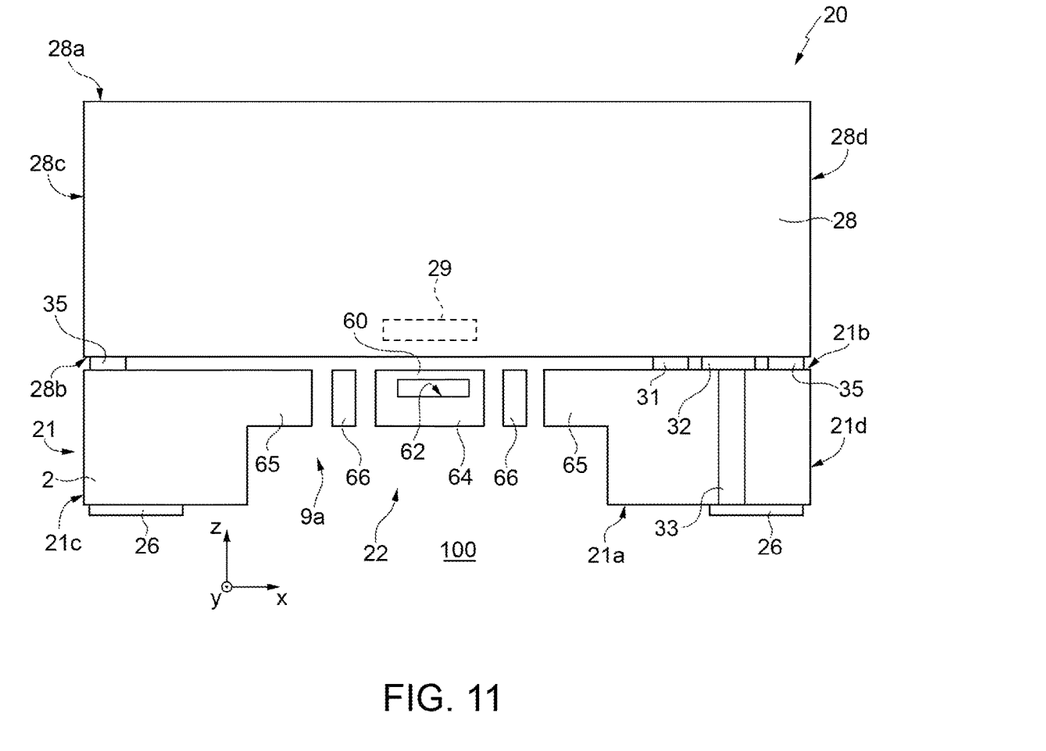
FIG. 11 is a schematic cross-sectional representation of a further embodiment of the assembly of the MEMS sensor device.

For instance, FIG. 11 shows a further embodiment, where the substrate 2 of the first die 21 comprises a micromechanical detection structure 22 designed to provide a pressure sensor, and including in this case a membrane, or diaphragm, 60, suspended over a cavity 62, buried within the substrate 2 and provided at the internal main face 21b of the first die 21.

In particular, the micromechanical detection structure 22 is here provided in an uncoupled portion 64 of the substrate 2, which is mechanically uncoupled from the remaining part of the substrate 2, designated by 65, according to the techniques described in detail in Patent Publication No. 2013/0168840, which was filed on Dec. 18, 2012 in the name of the present Applicant.

The uncoupled portion 64 is connected by means of elastic elements 66 to the remaining part 65 of the substrate 2 and is moreover suspended over the first cavity 9a provided in the same first die 21 in such a way as not to be in direct contact with the external environment 100 and the printed circuit board 59 (the first cavity 9a is hence set between the external environment 100 and the uncoupled portion 64, and the corresponding micromechanical detection structure 22 integrated therein).

Advantageously, as highlighted in the aforesaid Patent Publication No. 2013/0168840, this configuration enables mechanical uncoupling of the micromechanical detection structure 22 from the external environment 100, and elimination, or considerable reduction, of any stress induced by the same external environment (which could cause, for example, deformations, or in general undesirable mechanical stresses, in the micromechanical detection structure 22).

According to further variants, the first and/or second cavities 9a, 9b may not be present, for example, the second cavity 9b in the second die 28 (as illustrated in the aforesaid FIG. 11), in the case where an empty space is not required above the micromechanical structure provided in the first die 21.

Moreover, the geometrical shape of the cavities 9a, 9b may be different; for example, the side walls 30" of the second cavity 9b may be inclined by a non-zero angle with respect to the vertical axis z, according to the chemical-etching process used for formation of the same second cavity 9b.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS sensor device assembly comprising:
a single first semiconductor die having an internal surface and an opposite, external surface, a micromechanical detection structure integrated in the first semiconductor die at the internal surface; and
a single second semiconductor die having an internal surface and an opposite, external surface, an ASIC embedded in the second semiconductor die, the ASIC being operatively coupled to said micromechanical detection structure, the internal surface of the second semiconductor die coupled to the internal surface of said first semiconductor die, the external surfaces of the first and second semiconductor dice being exposed outer surfaces of the assembly, at least one of the external surfaces being configured to be placed in direct contact with a structure external to the assembly, the second semiconductor die having a cavity that at least partially receives the micromechanical detection structure of the first semiconductor die.

2. The assembly according to claim 1, wherein said external surfaces of said first and second semiconductor dice are in respective parallel planes, and said first and second semiconductor dice are coupled in a direction that is transverse to said planes.

3. The assembly according to claim 1, wherein said first and second semiconductor dice are configured to be mechanically and electrically coupled to the structure external to the assembly without interposition of packaging material.

4. The assembly according to claim 1, wherein the internal surface of the second semiconductor die is directly coupled to the internal surface of the first semiconductor die by electrical connection elements.

5. The assembly according to claim 1, wherein said external surface that is configured to be coupled directly to the structure external to the assembly includes a first electrical-connection element configured to electrically couple the assembly to said structure.

6. The assembly according to claim 5, further comprising:
a second electrical-connection element located between said internal surfaces of said first and second semiconductor dice and electrically coupling said micromechanical detection structure to said electronic circuit;
a conductive through via that extends through one of said first and second semiconductor dice; and
a third electrical-connection element located between said internal surfaces of said first and second semiconductor dice and configured to electrically couple to the first electrical-connection elements by the conductive through via.

7. The assembly according to claim 1, comprising a coupling ring between said first and second semiconductor dice that couples the first and second semiconductor dice together, the coupling ring surrounding said micromechanical detection structure.

8. The assembly according to claim 1, wherein said micromechanical detection structure is an acoustic transducer, and includes a substrate of semiconductor material having a first cavity, a membrane suspended over the first cavity, and a rigid plate capacitively coupled to the membrane.

9. The assembly according to claim 8, wherein:
the first semiconductor die includes a through opening that places the first cavity in fluid contact with an environment that is external to the assembly and allows acoustic-pressure waves to enter said assembly.

10. The assembly according to claim 1, wherein said micromechanical detection structure is a pressure sensor, and includes a substrate of semiconductor material having a membrane suspended over a buried cavity; wherein said pressure sensor further includes elastic elements that couple said membrane to said substrate, said membrane being suspended on one side by a cavity in the first semiconductor die.

11. The assembly according to claim 1, wherein said first and second semiconductor dice have external side surfaces that are transverse to said external surfaces and internal surfaces and are configured to be placed in direct contact with an external structure.

12. A MEMS sensor device assembly comprising:
a single first semiconductor die having an internal surface and an opposite, external surface, a first micromechanical detection structure integrated in the first semiconductor die at the internal surface;
a single second semiconductor die having an internal surface and an opposite, external surface, an ASIC embedded in the second semiconductor die, the ASIC being operatively coupled to said first micromechanical detection structure, the internal surface of the second semiconductor die coupled to the internal surface of said first semiconductor die, the external surfaces of the first and second semiconductor dice being exposed outer surfaces of the assembly, and at least one of the external surfaces being configured to be placed in direct contact with a structure external to the assembly, wherein said second semiconductor die includes a cavity that is located proximate the first micromechanical detection structure; and
a third semiconductor die integrating a second micromechanical detection structure, the third semiconductor die being secured to the internal surface of the second semiconductor die, housed within said cavity in said second semiconductor die, and facing, at a distance, said first micromechanical detection structure and being electrically coupled to said ASIC.

13. The assembly according to claim 12, wherein said cavity in said second semiconductor die has side walls, the assembly further comprises conductive paths having respective portions located on the side walls, respectively, and said second micromechanical detection structure in said third semiconductor die is coupled to said ASIC by the conductive paths.

14. The assembly according to claim 13, comprising a fourth semiconductor die integrating a third micromechanical detection structure, the fourth semiconductor die secured to the internal surface of the second semiconductor die and housed within said cavity in said second semiconductor die, said third micromechanical detection structure being electrically coupled to said ASIC.

15. An electronic apparatus, comprising:
a MEMS sensor device including:
a single first semiconductor die having a first surface, a second, opposite surface, and a micromechanical detection structure integrated in the first semiconductor die at the first surface; and
a single second semiconductor die having a first surface and a second, opposite surface, an ASIC integrated in the second semiconductor die at the first surface, the ASIC being operatively coupled to said micromechanical detection structure, the first surface of the second semiconductor die being coupled to the first surface of the first semiconductor die, the second surface of the first semiconductor die and the second surface of the second semiconductor die forming external surfaces of the assembly, the second semiconductor die having a cavity that at least partially receives the micromechanical detection structure of the first semiconductor die;

a printed circuit board coupled to conductive elements of one of the second surfaces of the first and second semiconductor dice without the interpositioning of packaging material.

16. The electronic apparatus according to claim 15, wherein the micromechanical detection structure is a pressure sensor that includes a semiconductor substrate, a suspended membrane that is elastically coupled to the substrate, and a rigid electrode that is capacitively coupled to the suspended membrane.

17. The electronic apparatus according to claim 15, wherein the first micromechanical detection structure is a first micromechanical detection structure, wherein the second semiconductor die includes a recess having a bottom surface formed in the first surface, the electronic apparatus further comprising a third semiconductor die secured to the bottom surface of the recess of the second semiconductor die, the third semiconductor die including a second micromechanical detection structure that is operatively coupled to the electronic circuit of the second semiconductor die.

18. The electronic apparatus according to claim 15, wherein the electronic apparatus is one of a mobile phone, PDS, notebook, voice recorder, audio player with voice-recording capacity, and hydrophone.

\* \* \* \* \*